(12) United States Patent
Zheng et al.

(10) Patent No.: US 9,762,028 B2
(45) Date of Patent: Sep. 12, 2017

(54) TWO-SECTION SEMICONDUCTOR LASER WITH MODULATION-INDEPENDENT GRATING SECTION TO REDUCE CHIRP

(71) Applicant: Applied Optoelectronics, Inc., Sugar Land, TX (US)

(72) Inventors: Jun Zheng, Missouri City, TX (US); Stefan Murry, Houston, TX (US); Klaus Alexander Anselm, Sugar Land, TX (US); Huanlin Zhang, Sugar Land, TX (US); Dion McIntosh-Dorsey, Stafford, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 25 days.

(21) Appl. No.: 14/590,456

(22) Filed: Jan. 6, 2015

(65) Prior Publication Data

US 2016/0197678 A1 Jul. 7, 2016

(51) Int. Cl.
*H01S 5/0625* (2006.01)
*H01S 5/062* (2006.01)
*H01S 5/024* (2006.01)

(52) U.S. Cl.
CPC ...... *H01S 5/06256* (2013.01); *H01S 5/06226* (2013.01); *H01S 5/02415* (2013.01)

(58) Field of Classification Search
USPC .......................... 372/10, 38, 96, 28; 725/129
See application file for complete search history.

(56) References Cited

U.S. PATENT DOCUMENTS

| | | | |
|---|---|---|---|
| 5,828,688 A | 10/1998 | Cook et al. | |
| 5,982,804 A | 11/1999 | Chen et al. | |
| 6,822,982 B2 | 11/2004 | Yoshida et al. | |
| 7,869,473 B2 | 1/2011 | Ye et al. | |

(Continued)

FOREIGN PATENT DOCUMENTS

WO 03079507 A2 9/2003

OTHER PUBLICATIONS

PCT Search Report and Written Opinion mailed Mar. 16, 2016, received in corresponding PCT Application No. PCT/US16/12307, 11 pgs.

(Continued)

*Primary Examiner* — David Payne
*Assistant Examiner* — Omar S Ismail
(74) *Attorney, Agent, or Firm* — Grossman Tucker Perreault & Pfleger, PLLC; Norman S. Kinsella

(57) ABSTRACT

A two-section semiconductor laser includes a gain section and a modulation-independent grating section to reduce chirp. The modulation-independent grating section includes a diffraction grating for reflecting light and forms a laser cavity with the gain section for lasing at a wavelength or range of wavelengths reflected by the diffraction grating. The gain section of the semiconductor laser includes a gain electrode for driving the gain section with at least a modulated RF signal and the grating section includes a grating electrode for driving the grating section with a DC bias current independent of the modulation of the gain section. The semiconductor laser may thus be directly modulated with the modulated RF signal without the modulation significantly affecting the index of refraction in the diffraction grating, thereby reducing chirp.

11 Claims, 2 Drawing Sheets

(56) References Cited

U.S. PATENT DOCUMENTS

| | | | |
|---|---|---|---|
| 2006/0088066 A1* | 4/2006 | He | H01S 5/0265 372/10 |
| 2007/0230533 A1* | 10/2007 | Park | H01S 5/0265 372/96 |
| 2009/0238224 A1* | 9/2009 | Ye | H01S 5/06256 372/28 |
| 2010/0260220 A1* | 10/2010 | Yoffe | H01S 5/06258 372/38.02 |
| 2012/0163405 A1 | 6/2012 | Su et al. | |
| 2013/0191877 A1* | 7/2013 | Rakib | H04N 21/6118 725/129 |
| 2014/0241166 A1 | 8/2014 | Hart et al. | |
| 2014/0300953 A1 | 10/2014 | Whitbread et al. | |

OTHER PUBLICATIONS

Spencer, John E. and Young, Preston, "Contrasting the Photodigm DBR Laser Diode Architecture with Competing DFB Designs", Photodigm, Inc., 2014, 3 pgs.

\* cited by examiner

TWO-SECTION SEMICONDUCTOR LASER WITH MODULATION-INDEPENDENT GRATING SECTION TO REDUCE CHIRP

TECHNICAL FIELD

The present invention relates to semiconductor lasers and more particularly, to a two-section semiconductor laser including a modulation-independent grating section to reduce chirp.

BACKGROUND INFORMATION

Semiconductor lasers are used in optical transmitters for transmitting data over optical fibers in various applications. In cable TV (CATV) applications, for example, optical transmitters may be used to transmit video and broadband signals to customers using dense wavelength division multiplexing (DWDM). The Data Over Cable Service Interface Specification (DOCSIS) standard governs the transmission of high-bandwidth data to an existing CATV system to provide internet access over an existing CATV infrastructure. The most recent DOCSIS 3.1 standard allows higher RF frequencies (e.g., 1.2 GHz and above), which increases bandwidth.

When modulating semiconductor lasers in optical transmitters, higher RF frequencies may present problems and challenges. One problem is caused by chirp in the output of the semiconductor laser, which is a change in frequency as a function of time. In particular, chirp may lead to signal degradation of a modulated optical signal, especially for higher RF frequencies over longer transmission distances. To meet the requirements of the most recent DOCSIS 3.1 specification, the semiconductor lasers used in optical transmitters should be capable of supporting higher RF frequencies (e.g., 1.2 GHz and above) with lower chirp (e.g., less than 60 MHz/mA).

Chirp may be reduced by using external cavity lasers with an external grating as an exit reflector; however, external cavity lasers present problems with optical coupling and with the packaging. External modulators may also be used to reduce chirp but may not be capable of providing enough power for use in an optical transmitter for CATV applications.

BRIEF DESCRIPTION OF THE DRAWINGS

These and other features and advantages will be better understood by reading the following detailed description, taken together with the drawings wherein.

DETAILED DESCRIPTION

Figure 1A:
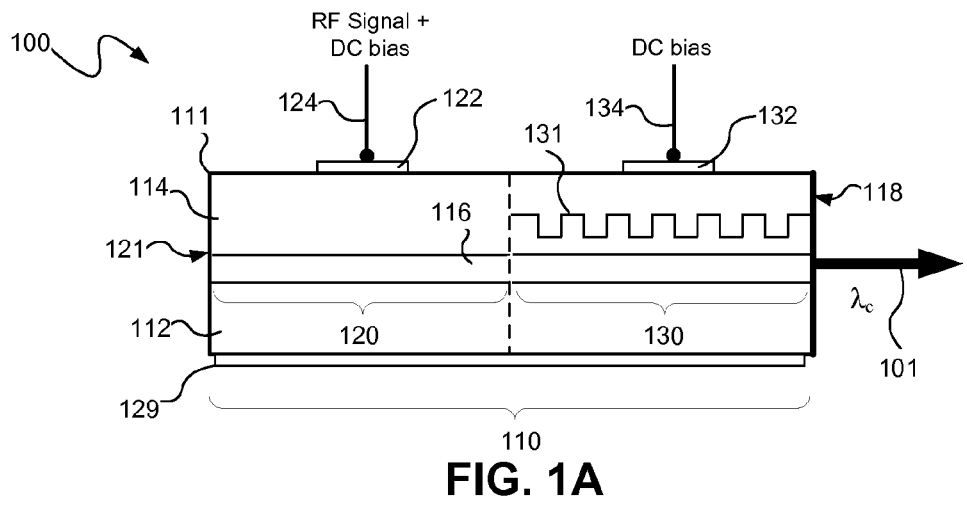
FIG. 1A is a side, schematic view of a two-section semiconductor laser with a modulation-independent grating section, consistent with embodiments of the present application.

A two-section semiconductor laser, consistent with embodiments of the present disclosure, includes a gain section and a modulation-independent grating section to reduce chirp. The modulation-independent grating section includes a diffraction grating for reflecting light and forms a laser cavity with the gain section for lasing at a wavelength or range of wavelengths reflected by the diffraction grating. The gain section of the semiconductor laser includes a gain electrode for driving the gain section with at least a modulated RF signal and the grating section includes a grating electrode for driving the grating section with a DC bias current independent of the modulation of the gain section. The semiconductor laser may thus be directly modulated with the modulated RF signal without the modulation significantly affecting the index of refraction in the diffraction grating, thereby reducing chirp.

The two-section semiconductor laser may be used in optical transmitters, for example, in a CATV headend where video and broadband signals are aggregated onto an optical fiber for transmission to a cable network. The CATV headend may provide high-bandwidth data to an existing cable network in accordance with the Data Over Cable Service Interface Specification (DOCSIS) standard 3.1. In particular, the CATV headend may use quadrature amplitude modulation (QAM) to modulate RF signals with broadband data at RF frequencies up to 1.2 GHz and higher.

The two-section semiconductor laser, consistent with embodiments of the present disclosure, may be directly modulated by a QAM modulated RF signal and allows chirp to be reduced sufficiently to support the higher RF frequencies (e.g., 1.2 GHz and above) enabled under DOCSIS 3.1. In at least one embodiment, the two-section semiconductor laser allows the chirp to be reduced by as much as a factor of 3. As compared to a conventional DFB laser used for a QAM application, for example, an embodiment of the two-section semiconductor laser may reduce chirp below 60 MHz/mA to as low as 20 MHz/mA. Other levels of chirp may also be possible depending upon the particular application, the RF frequencies, and the transmission distances.

As used herein, "modulation-independent grating section" refers to a section of a semiconductor laser that is not modulated with an RF signal. As used herein, "channel wavelengths" refer to the wavelengths associated with optical channels and may include a specified wavelength band around a center wavelength. In one example, the channel wavelengths may be defined by an International Telecommunication (ITU) standard such as the ITU-T dense wavelength division multiplexing (DWDM) grid. The term "coupled" as used herein refers to any connection, coupling, link or the like and "optically coupled" refers to coupling such that light from one element is imparted to another element. Such "coupled" devices are not necessarily directly connected to one another and may be separated by intermediate components or devices that may manipulate or modify such signals.

Figure 1B:
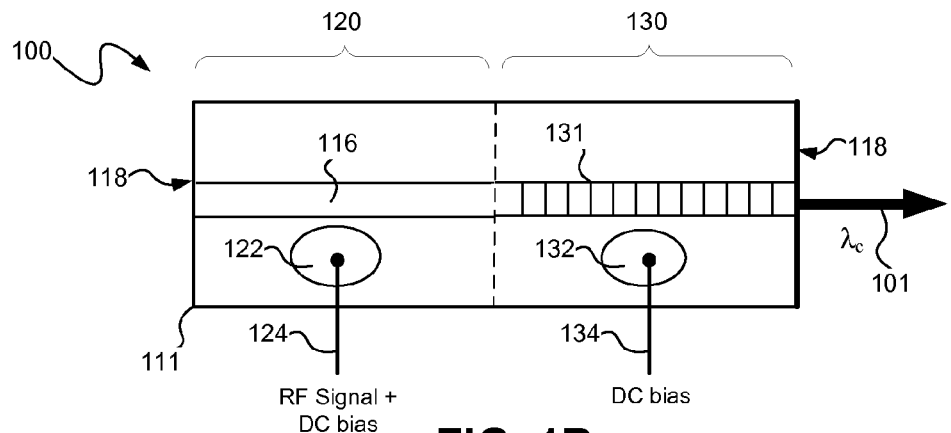
FIG. 1B is a top, schematic view of the two-section semiconductor laser shown in FIG. 1A.

Referring to FIGS. 1A and 1B, a two-section semiconductor laser 100, consistent with embodiments of the present disclosure, is described in greater detail. The two-section semiconductor laser 100 generally includes a laser cavity 110 formed by a gain section 120 without a diffraction grating and a modulation-independent grating section 130 with a diffraction grating 131. The gain section 120 and the grating section 130 are integrated into the same semiconductor chip or structure 111. The semiconductor structure 111 includes a plurality of semiconductor layers 112, 114 forming or defining at least one active region 116 at the junction between the semiconductor layers 112, 114. The active region 116 extends throughout the laser cavity 110 and is located in both the gain section 120 and the grating section 130.

The diffraction grating 131 in the grating section 130 reflects a wavelength or range of wavelengths of light generated in the gain section 120 such that the two-section semiconductor laser 100 lases and emits laser light 101 at the reflected wavelength(s). The example embodiment of the semiconductor laser 100 is not tunable and is configured to emit laser light 101 at a fixed wavelength or range of wavelengths. In embodiments described herein, the diffraction grating 131 may be configured such that the two-section semiconductor laser 100 lases and emits the laser light 101 at a fixed channel wavelength $\lambda_c$ such as a channel wavelength in the C-band from 1530 to 1570 nm. Different grating structures may be used in the diffraction grating 131, for example, to provide different channel wavelengths. The two-section semiconductor laser 100 may also be configured to produce an optical output power of greater than 15 mW.

In the illustrated embodiment, the lasing cavity 110 includes a back reflector 121 and the diffraction grating 131 acts as an exit reflector. The back reflector 121 may be sufficiently reflective (e.g., at least 80% reflective) to cause lasing and may include, for example, a highly reflective (HR) coating or a thin film reflector on the back facet of the semiconductor structure 111 adjacent the gain section 120. In one embodiment, the back reflector 121 may have about 80-90% reflectivity to allow a portion of light to pass through the back of the laser 100 for sensing by a monitor photodiode (not shown). The front facet of the semiconductor structure 111 adjacent the grating section 130 includes an anti-reflective (AR) coating 118 (e.g., less than 1% reflective). In other embodiments, the gain section 120 and the grating section 130 may be reversed and the diffraction grating 131 may act as the back reflector.

A gain electrode 122 is located on the gain section 120 and is electrically coupled to the active region 116 in the gain section 120 for driving the gain section with an RF signal, such as a modulated RF signal from a CATV headend. The gain section 120 may also be driven with a DC bias current in addition to the RF signal. A grating electrode 132 is located on the modulation-independent grating section 130 and is electrically coupled to the active region 116 in the grating section 130 for driving the grating section 130 with a DC bias current. The gain electrode 122 and the grating electrode 132 are separated and isolated from each other for independently applying drive currents to the gain section 120 and the grating section 130, respectively. In other words, the gain section 120 and the grating section 130 are electrically independent in that the drive currents applied to the gain section 120 have minimal affect on the grating section 130, and vice versa.

At least one bottom electrode 129 is located on an opposite side of the semiconductor structure 111. The electrodes 122, 132, 129 may be formed as metal pads or contacts using a conductive metal such as gold. Wires 124, 134 may be wirebonded to the gain electrode 122 and the grating electrode 132, respectively, to provide the drive currents for the respective RF signal and DC bias current. One or more wires may also be wirebonded to the bottom electrode 129. Although the illustrated embodiment shows a particular size and shape for the electrodes 122, 132, 129, the electrodes 122, 132, 129 may have other sizes, shapes and configurations.

Driving the gain section 120 with the RF signal via the gain electrode 122 directly modulates the gain section 120, causing the gain section 120 to generate modulated laser light in response to the RF signal. By using a separate gain electrode 122 and grating electrode 132 and not driving the grating section 130 with the RF signal, the two-section semiconductor laser 100 may be directly modulated by the RF signal without the modulation affecting the index of refraction of the diffraction grating 131, thereby reducing chirp. The grating section 130 is biased with the DC bias current via the grating electrode 132 to prevent or reduce absorption of light in the grating section 130 such that the grating section is sufficiently transparent to allow reflection by the diffraction grating 131. The grating section 130 may be biased with the DC bias current in a range of 0-10 mA. The modulated laser light generated by the gain section 120 is reflected between the back reflector 121 and the diffraction grating 131 until lasing occurs and the modulated laser light 101 is emitted from the semiconductor laser 100.

The semiconductor laser 100 may include one or more n-type semiconductor layers 112 and one or more p-type semiconductor layers 114. The active region 116 is generally formed at a junction of the n-type semiconductor layer(s) 112 and the p-type semiconductor layer(s) 114 and may include an intrinsic layer between the n-type semiconductor layer(s) 112 and the p-type semiconductor layer(s) 114 forming a PIN junction. The semiconductor structure 111 may form, for example, a quantum well laser or multiple quantum well laser. The semiconductor layers 112, 114 may include any semiconductor material used in semiconductor laser diodes including, without limitation, indium phosphide (InP), gallium arsenide (GaAs), and aluminum (Al).

The semiconductor laser 100 may be formed using known semiconductor manufacturing techniques. The semiconductor layers 112, 114 may be deposited and the diffraction grating 131 may be formed in one or more of the semiconductor layers 112, 114 adjacent the active region 116 in the grating section 130. Conductive metal may then be deposited on the gain section 120 and the grating section 130, respectively, to form the gain electrode 122 and the grating electrode 132. Conductive metal may also be deposited on the bottom of the outer semiconductor layer 112 to form the bottom electrode 129. The wires 124, 134 may then be wirebonded to the electrodes 122, 132, respectively.

According to one example method, the semiconductor layers 112, 114 may be epitaxially grown and the diffraction grating 131 may be formed in the epitaxially grown layer(s) adjacent the active region 116 in the grating section 130 using known techniques for use in forming a distributed Bragg reflector (DBR), such as etching or photolithography. According to this method, the two-section semiconductor laser 100 may be manufactured without any further epitaxial re-growth over the diffraction grating 131. Because epitaxial re-growth is a difficult process, this technique for manufacturing the two-section semiconductor laser 100 is advantageous, for example, compared to manufacturing conventional distributed Bragg reflector (DBR) lasers with epitaxial re-growth.

Figure 2:
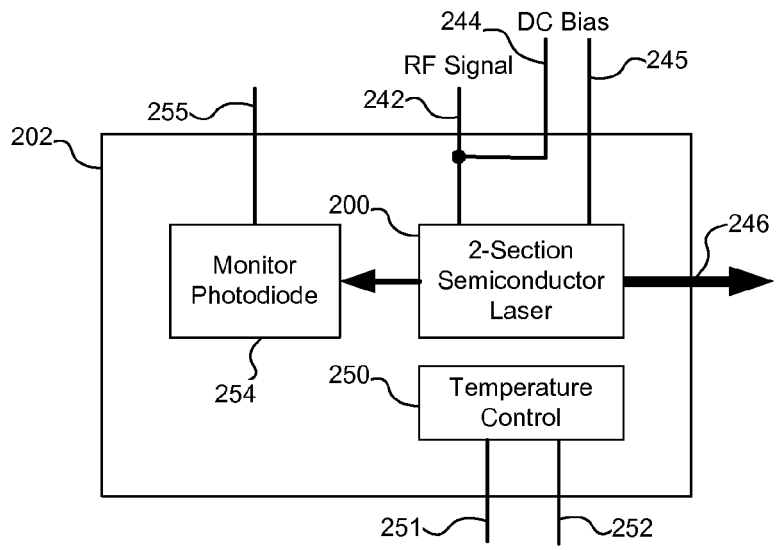
FIG. 2 is a schematic view of an optical transmitter including a two-section semiconductor laser, consistent with embodiments of the present disclosure.

FIG. 2 shows one embodiment of an optical transmitter 202 including a two-section semiconductor laser 200, consistent with embodiments of the present disclosure. The two-section semiconductor laser 200 may include a modulation-independent grating section to reduce chirp, as described above. The optical transmitter 202 may be used, for example, in CATV applications for direct-modulation QAM transmissions at a fixed channel wavelength, as described in greater detail below. The optical transmitter 200 and the two-section semiconductor laser 100, 200 described herein may also be used in other applications.

The optical transmitter 202 includes a laser modulation input 242 for receiving a modulated RF signal, a laser DC bias input 244 for receiving a DC bias current for the gain section, and a grating DC bias input 245 for receiving a DC bias current for the grating section. The grating section of the two-section semiconductor laser 200 is electrically connected to the grating DC bias input 245 but is not electrically connected to the laser modulation input 242. The gain section of the two-section semiconductor laser 200 is electrically connected to the laser modulation input 242 and to the laser DC bias input 244. The optical transmitter 202 further includes a laser optical output 246 for providing the modulated optical signal, for example, at a fixed channel wavelength.

This embodiment of the optical transmitter 202 also includes a temperature control system 250 thermally coupled to the semiconductor laser 200 and a monitor photodiode 254 optically coupled to a backside of the semiconductor laser 200. The temperature control system 250 provides wavelength control and may include a thermoelectric cooler (TEC) for cooling the laser 200 and a thermistor for monitoring a temperature within the optical transmitter 202. The temperature control system 250 may also include a heater (e.g., a resistive heater) for heating the laser 200. The temperature control system 250 may be electrically connected to one or more temperature control inputs and outputs 251, 252. The monitor photodiode 254 may be used to monitor an optical output of the laser 200 and may be electrically connected to a monitor photodiode output 255.

The optical transmitter 202 may be packaged, for example, in a butterfly package. The butterfly package may include a housing enclosing the two-section semiconductor laser 200, the temperature control system 250, and the monitor photodiode 252. The butterfly package may further includes pins providing the electrical inputs and outputs 242, 244, 251, 252, 255 and an optical fiber or waveguide providing the optical output 246.

Figure 3:
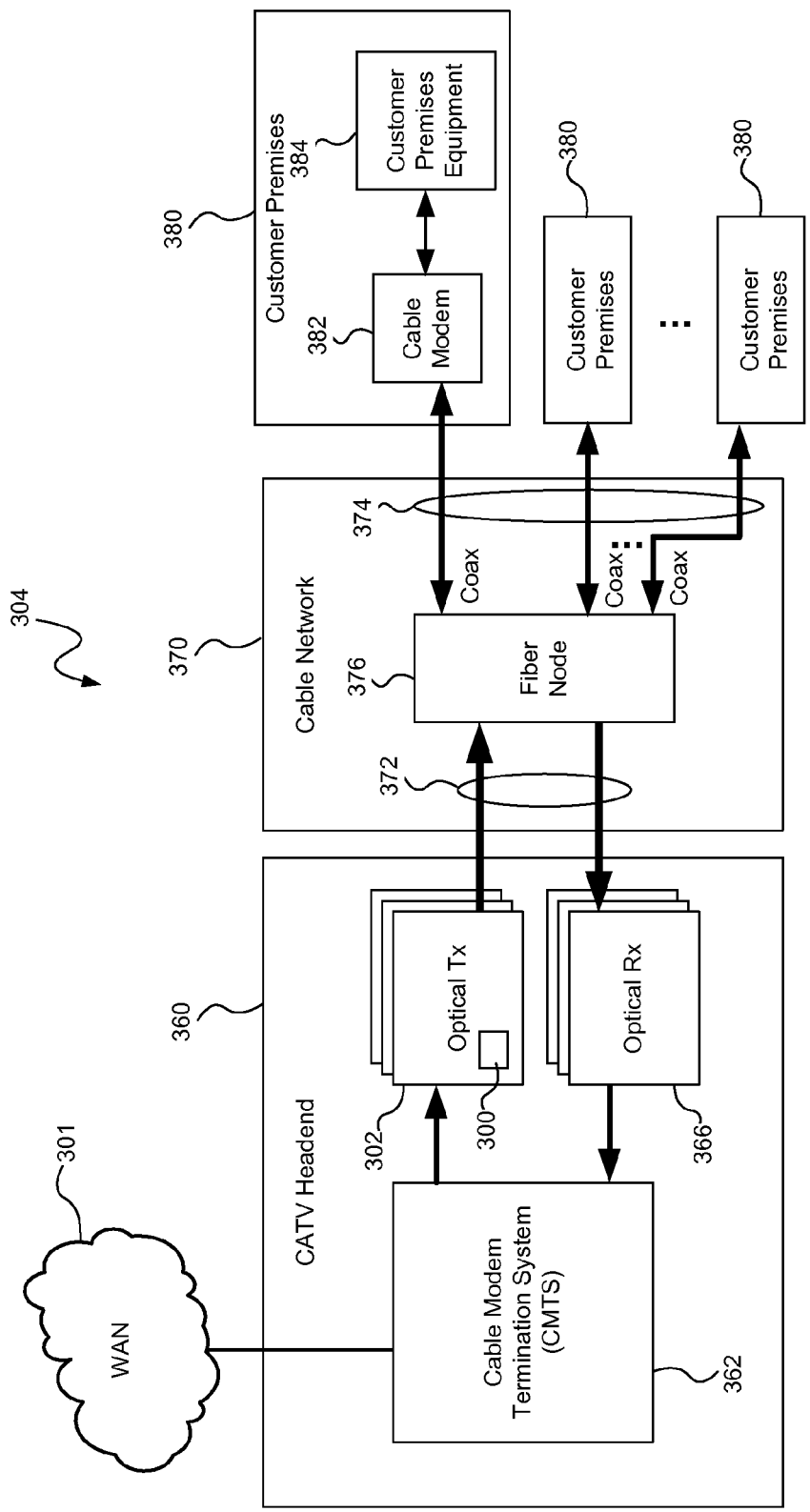
FIG. 3 is a schematic view of a CATV system including an optical transmitter with a two-section semiconductor laser, consistent with embodiments of the present disclosure.

FIG. 3 shows one embodiment of a CATV system 304 in which an optical transmitter 302 with a two-section semiconductor laser 300 may be used, consistent with embodiments of the present disclosure. The CATV system 304 includes a CATV headend 360 that receives, processes, and combines broadcast, narrowcast and other signals to be carried on a cable network 370 to customer premises 380. The cable network 370 includes a combination of one or more fiber optic cables 372 and a coaxial cable distribution network 374, also referred to as hybrid fiber/coax (HFC). One or more fiber nodes 376 provide an optical-to-electrical interface between the fiber optic cable(s) 372 and the coaxial cable distribution network 374. The customer premises 380 includes a cable modem 382 connected to customer premises equipment 384 (e.g., a router).

The CATV headend 360 includes a cable modem termination system (CMTS) 362 that enables connectivity to a wide-area network 301, such as the Internet, from the cable modem 382 at the customer premises 380. The CATV headend 360 also includes a plurality of optical transmitters 302 and a plurality of optical receivers 366 electrically connected to the CMTS 362 and optically coupled to the fiber optic cable(s) 372. The CATV headend 360 may be compliant with at least the DOCSIS 3.1 standard including any revisions or subsequent versions thereof.

Each of the optical transmitters 302 in the CATV headend 360 may include a two-section semiconductor laser 300 with a modulation-independent grating section, as described above. The optical transmitters 302 receive modulated RF signals from the CMTS 362 and transmit corresponding modulated optical signals over the fiber optic cable(s) 372. When the CATV headend 360 is compliant with at least the DOCSIS 3.1 standard, the modulated RF signals are modulated using quadrature amplitude modulation (QAM) and have RF frequencies of 1.2 GHz or greater. Each of the optical transmitters 302 transmits the corresponding modulated optical signal at a respective channel wavelength, for example, within the C band from 1530 to 1570 nm. By using the two-section semiconductor laser 300 with a modulation-independent grating section, as described above, the chirp of the modulated optical signal may be reduced to 20 MHz/mA to allow transmission of the modulated optical signals at RF frequencies of 1.2 GHz or greater consistent with DOCSIS 3.1. In other embodiments, the chirp may be reduced to other levels below 60 MHz/mA including, without limitation, 30 MHz/mA.

Accordingly, the two-section semiconductor laser with a modulation-independent grating section, consistent with embodiments disclosed herein, allows optical transmitters to meet the high frequency requirements of DOCSIS 3.1 without using external modulators or external cavity lasers.

Consistent with one embodiment, a semiconductor laser device includes a laser cavity formed by a plurality of semiconductor layers defining at least one active region extending through the laser cavity. The laser cavity includes a gain section without a diffraction grating and a grating section with a diffraction grating. A gain electrode is located on an outer portion of the semiconductor layers in the gain section and electrically coupled to the active region in the gain section for driving the gain section with a DC bias and with a modulated RF signal to modulate the gain section. A grating electrode is located on an outer portion of the semiconductor layers in the grating section and electrically coupled to the active region in the grating section for driving the grating section with a DC bias independent of modulation of the gain section.

Consistent with another embodiment, an optical transmitter includes a laser modulation input for receiving a modulated RF signal, at least one laser DC bias input for receiving a DC bias current, a laser optical output for providing a modulated optical signal, and a two-section semiconductor laser device electrically connected to the laser modulation input, the laser DC bias input, and the laser optical output. The semiconductor laser device includes a laser cavity formed by a plurality of semiconductor layers defining at least one active region extending through the laser cavity. The laser cavity includes a gain section without a diffraction grating and a grating section with a diffraction grating and is configured to lase at a fixed channel wavelength. A gain electrode is located on an outer portion of the semiconductor layers in the gain section. The gain electrode is electrically coupled to the laser DC bias input and the laser modulation input and to the active region in the gain section for driving the gain section with the DC bias current and with the modulated RF signal to modulate the gain section. A grating electrode is located on an outer portion of the semiconductor layers in the grating section. The grating electrode is electrically coupled to the laser DC bias input and to the active region in the grating section for driving the grating section with the DC bias current independent of modulation of the gain section.

Consistent with a further embodiment, a method is provided for generating a modulated optical signal with reduced chirp. The method includes: providing a semiconductor laser including a laser cavity formed by a plurality of semiconductor layers defining at least one active region extending through the laser cavity, the laser cavity including a gain section without a diffraction grating and a grating section with a diffraction grating; driving the grating section with a DC bias current; and driving the gain section with a DC bias current and with a modulated RF signal to modulate the gain section without modulating the grating section to generate a modulated optical signal at a fixed channel wavelength While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A semiconductor laser device comprising: a laser cavity formed by a plurality of semiconductor layers defining at least one active region extending through the laser cavity, the laser cavity including a gain section without a diffraction grating and a grating section with a diffraction grating, wherein the laser cavity is configured to produce chirp less than 30 MHz/mA when the gain section is modulated at frequencies of 1.2 GHz or greater, and wherein the laser cavity is configured to lase at a fixed channel wavelength in a range of 1530 to 1570 nm; a gain electrode located on an outer portion of the semiconductor layers in the gain section and electrically coupled to the active region in the gain section for driving the gain section with a DC bias and with a modulated RF signal to modulate the gain section; and a grating electrode located on an outer portion of the semiconductor layers in the grating section and electrically coupled to the active region in the grating section for driving the grating section with a DC bias independent of modulation of the gain section.

2. The semiconductor laser device of claim 1 wherein the semiconductor layers include at least one p-type semiconductor layer and at least one n-type semiconductor layer.

3. The semiconductor laser device of claim 2 wherein the semiconductor layers further include an intrinsic layer forming the active region between the at least one p-type semiconductor layer and the at least one n-type semiconductor layer.

4. The semiconductor laser device of claim 1 further including a highly reflective coating on a facet adjacent the gain section and an anti-reflective coating on a facet adjacent the grating section.

5. The semiconductor laser device of claim 1 wherein the laser cavity is configured to produce an optical output power of greater than 15 mW.

6. The semiconductor laser device of claim 1 wherein the diffraction grating is formed in the grating section without re-growth.

7. An optical transmitter comprising: a laser modulation input for receiving a modulated RF signal, wherein the modulated RF signal has an RF frequency of 1.2 GHz or greater, at least one laser DC bias input for receiving a DC bias current; a laser optical output for providing a modulated optical signal; and a two-section semiconductor laser device electrically connected to the laser modulation input, the laser DC bias input, and the laser optical output, the semiconductor laser device comprising: a laser cavity formed by a plurality of semiconductor layers defining, at least one active region extending through the laser cavity, the laser cavity including a gain section without a diffraction grating and a grating section with a diffraction grating, the laser cavity being configured to lase at a fixed channel wavelength and the laser cavity being configured to produce chirp less than 30 MHz/mA; a gain electrode located on an outer portion of the semiconductor layers in the gain section, wherein the gain electrode is electrically coupled to the laser DC bias input and the laser modulation input and to the active region in the gain section for driving the gain section with the DC bias current and with the modulated RF signal to modulate the gain section; and a grating electrode located on an outer portion of the semiconductor layers in the grating section, wherein the grating electrode is electrically coupled to the laser DC bias input and to the active region in the grating section for driving the grating section with the DC bias current independent of modulation of the gain section.

8. The optical transmitter of claim 7 wherein the fixed channel wavelength is in a range of 1530 to 1570 nm.

9. A method of generating a modulated optical signal with reduced chirp, the method comprising: providing a semiconductor laser including a laser cavity formed by a plurality of semiconductor layers defining at least one active region extending through the laser cavity, the laser cavity including a gain section without a diffraction grating and a grating section with a diffraction grating; driving the grating section with a DC bias current; and driving the gain section with a DC bias current and with a modulated RF signal to modulate the gain section without modulating the grating section to generate a modulated optical signal at a fixed channel wavelength, wherein the modulated RF signal has a frequency of 1.2 GHz or greater and wherein the modulation of the gain section produces chirp less than 30 MHz/mA.

10. The method of claim 9 wherein the modulation of the gain section produces chirp of about 20 MHz/mA.

11. The method of claim 8 wherein the fixed channel wavelength is in a range of 1530 to 1570 nm.

* * * * *